(12) United States Patent
Chen

(10) Patent No.: US 12,349,306 B1
(45) Date of Patent: Jul. 1, 2025

(54) STORAGE RACK

(71) Applicant: Gang Chen, Dongguan (CN)

(72) Inventor: Gang Chen, Dongguan (CN)

( * ) Notice: Subject to any disclaimer, the term of this patent is extended or adjusted under 35 U.S.C. 154(b) by 0 days.

(21) Appl. No.: 18/935,730

(22) Filed: Nov. 4, 2024

(51) Int. Cl.
*H05K 7/18* (2006.01)

(52) U.S. Cl.
CPC ..................... *H05K 7/18* (2013.01)

(58) Field of Classification Search
CPC ............... H05K 7/18; A47B 2097/003; A47B 2097/005; A47B 21/06; A47B 2021/064; A47B 2021/066; A47B 2200/0081; A47B 2200/0082; A47B 2200/0083; H01R 9/031; H01R 13/648; H01R 31/02; H01R 25/003; H02G 3/06; F16L 25/01; F16L 25/02
See application file for complete search history.

(56) References Cited

U.S. PATENT DOCUMENTS

| | | | | |
|---|---|---|---|---|
| 4,820,204 A | * | 4/1989 | Batty | H01R 13/645 |
| | | | | 439/701 |
| 4,960,388 A | * | 10/1990 | Frantz | H01R 9/031 |
| | | | | 439/474 |
| D362,229 S | * | 9/1995 | Moses | D13/137.3 |
| 6,486,407 B1 | * | 11/2002 | Hawker | H01R 31/02 |
| | | | | 174/72 R |
| 7,470,154 B2 | * | 12/2008 | Sato | H01R 33/765 |
| | | | | 439/693 |
| 8,191,487 B2 | * | 6/2012 | Theesfeld | F16M 11/24 |
| | | | | 108/50.01 |
| 9,337,582 B2 | * | 5/2016 | Sato | H01R 13/641 |
| 10,128,613 B2 | * | 11/2018 | Yang | H01R 24/28 |
| 10,765,950 B1 | * | 9/2020 | Clementi | H01R 13/6658 |
| 11,849,261 B1 | * | 12/2023 | Shi | B60R 11/04 |
| 2020/0350735 A1 | * | 11/2020 | Huang | H01R 13/02 |
| 2024/0286656 A1 | * | 8/2024 | Hellige | H01R 31/02 |

FOREIGN PATENT DOCUMENTS

CN 218074036 U 12/2022

* cited by examiner

*Primary Examiner* — Ko H Chan
(74) *Attorney, Agent, or Firm* — Daniel M. Cohn

(57) ABSTRACT

A storage rack is provided, which includes a base, the base is provided with a support frame, the support frame is provided with a plurality of support boards, the support boards are provided with an electrical appliance, the support frame is provided with an installation channel, the installation channel is provided with a plurality of cable connectors that are communicated with each other. The cable connectors are electrically connected to the electrical appliance. Providing the cable connectors in the support frame can effectively prevent external mechanical damage, such as preventing insects and rodents from biting wires and extending the service life of the cable connectors; at the same time, it renders the storage rack more tidy and beautiful, thereby enhancing its aesthetic appeal.

6 Claims, 6 Drawing Sheets

STORAGE RACK

TECHNICAL FIELD

The present disclosure relates to the field of storage rack technologies, and in particular, to a storage rack.

BACKGROUND

Storage racks are widely used in places such as shopping malls, supermarkets, storehouse, warehouses, offices, and homes. In order to make the storage racks more aesthetically pleasing and practical, proving lighting fixtures on the storage racks has become a common phenomenon. For example, Chinese Patent No. CN218074036U discloses a storage rack with lighting effect, which distributes multiple installation frames vertically at intervals, connects them between multiple columns, and installs support plates on the installation frames to form a vertical storage rack with multiple compartments. Each compartment can be used to place items, and at least one light slot is set on one side of the installation frame. LED light strips electrically connected to a power supply component are installed in the light slot to provide lighting effect for objects placed on the support plates. Of course, a user can also choose not to place items on the storage rack, but use the storage rack as a decorative fixture. Compared with traditional ones, this utility model is provided with the LED light strips on the storage rack to provide illumination for objects placed on the support board, effectively avoiding a problem of collision with the storage rack during walking due to insufficient light at night. At the same time, the LED light strips can also improve the decorative effect of the storage rack. An overall structure is simple and the installation and disassembly are very convenient.

In the above-mentioned patent, it is disclosed that "an outer side of an exposed part of a power socket is provided with an extension portion having a lead groove when extending horizontally towards a direction of the column. After the power connector is plugged into the power socket, a distribution body can be inserted into the lead groove, so that a main wire body is distributed outside the column". As shown in FIG. 1 of the description, the main wire body is distributed on the outside of the column and may be damaged during use or transportation, thereby effecting an overall beauty of the storage rack.

SUMMARY

The purpose of the present disclosure is to provide a storage rack to solve problems raised in the background technology mentioned above.

To achieve the above objectives, the technical solution adopted by the present disclosure is: a storage rack, including a base, where the base is provided with a support frame, the support frame is provided with a plurality of support boards, the support boards are provided with an electrical appliance, and the support frame is provided with an installation channel, the installation channel is provided with a plurality of cable connectors that are communicated with each other, the cable connectors are electrically connected to the electrical appliance.

Compared with existing technologies, providing the cable connectors in the support frame can effectively prevent external mechanical damage, such as preventing insects and rodents from biting wires and extending the service life of cable connectors; at the same time, it renders the storage rack more tidy and beautiful, thereby enhancing its aesthetic appeal.

In some embodiments of the present disclosure, the cable connectors include a protective wire, one end of the protective wire is provided with a power inlet joint, and the other end of the protective wire is provided with at least one power outlet joint; the power outlet joint and the power inlet joint are both cylindrical and compatible with each other.

In some embodiments of the present disclosure, the power outlet joint includes a grip column, the grip column is provided with a reinforcing column; the reinforcing column is provided with a plug-in column, the reinforcing column is located between the plug-in column and the grip column; the plug-in column is provided with a plurality of installation holes; each of the plurality of installation holes is fixedly provided with a cylindrical socket terminal.

In some embodiments of the present disclosure, the power inlet joint includes a cylindrical connection column, the connection column is provided with a socket, and a diameter of the connection column is larger than that of the socket; the socket is provided with a connection hole that is compatible with the plug-in column; the connection hole is provided with a cylindrical pin terminal that is compatible with the socket terminal.

In some embodiments of the present disclosure, two sides of the socket are symmetrically provided with a reinforcement block, one end of the reinforcement block is fixedly connected to the connection column, and the other end thereof is extended along an axial direction of the socket and is a free end.

In some embodiments of the present disclosure, both the power outlet joint and the power inlet joint are provided with wires, one end of the wire located in the power outlet joint is connected to the socket terminal, the other end thereof is extended outside the power outlet joint; the wires located outside the power outlet joint and the power inlet joint are all located inside the protective wire; one end of the wire located in the power inlet joint is electrically connected to the pin terminal, the other end thereof is extended through the connection column to an outside of the power inlet joint.

In some embodiments of the present disclosure, the connection hole of the power inlet joint is provided with a guide block along an axial direction, an outer surface of the plug-in column of the power outlet joint is provided with a guide groove that is compatible with the guide block.

In some embodiments of the present disclosure, the socket is provided with a clamp hole that is radially penetrated; an axis of the clamp hole is perpendicular to an axis of the guide block; an outer surface of the plug-in column is symmetrically provided with a clamp column that is compatible with the clamp hole; an axis of the clamp column is perpendicular to an axis of the guide groove.

In some embodiments of the present disclosure, one end of the protective wire is provided with one power inlet joint; the other end thereof is provided with one power outlet joint.

In some embodiments of the present disclosure, one end of the protective wire is provided with a dispersing block, the other end of the protective wire is provided with one power inlet joint, and one end of the dispersing block is provided with a plurality of connection wires with same structure as the protective wire, and each end of the connection wires is provided with the power outlet joint.

In addition to the technical problems solved by the present invention, the technical features constituting the technical solution, and the advantages brought by these technical features, other technical problems that can be solved by the present disclosure, other technical features included in the technical solution, and the advantages brought by these technical features will be further explained in detail with reference to the accompanying drawings.

Figure 1:
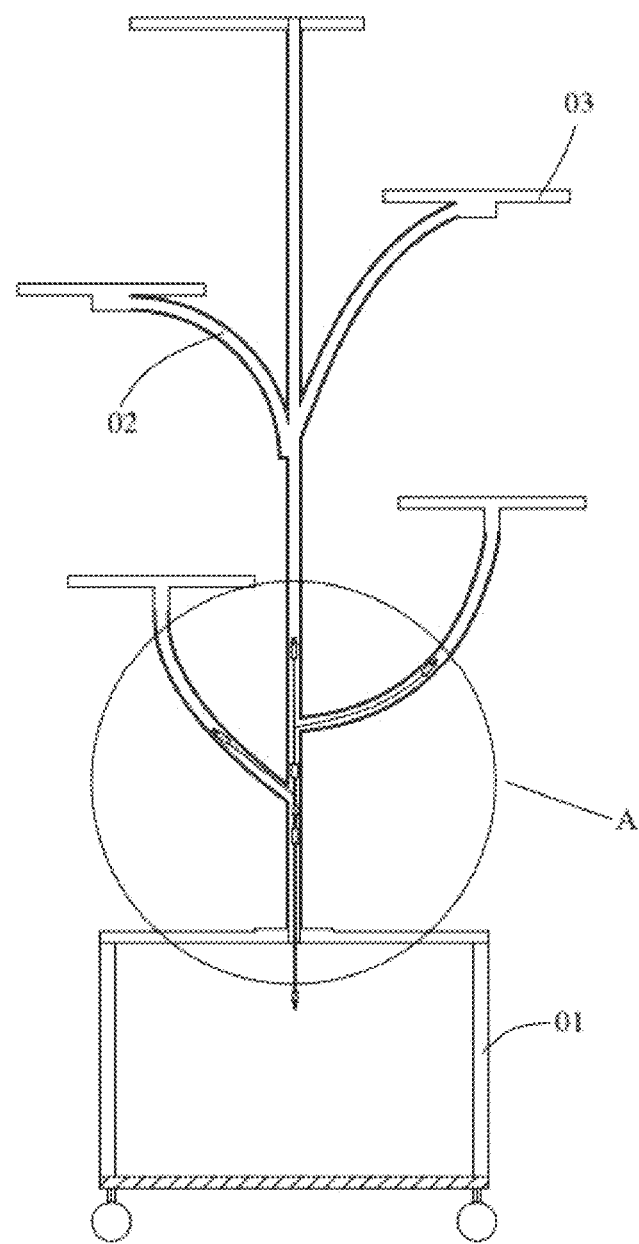
FIG. 1 is a sectional view of an assembly of the present disclosure.
Figure 2:
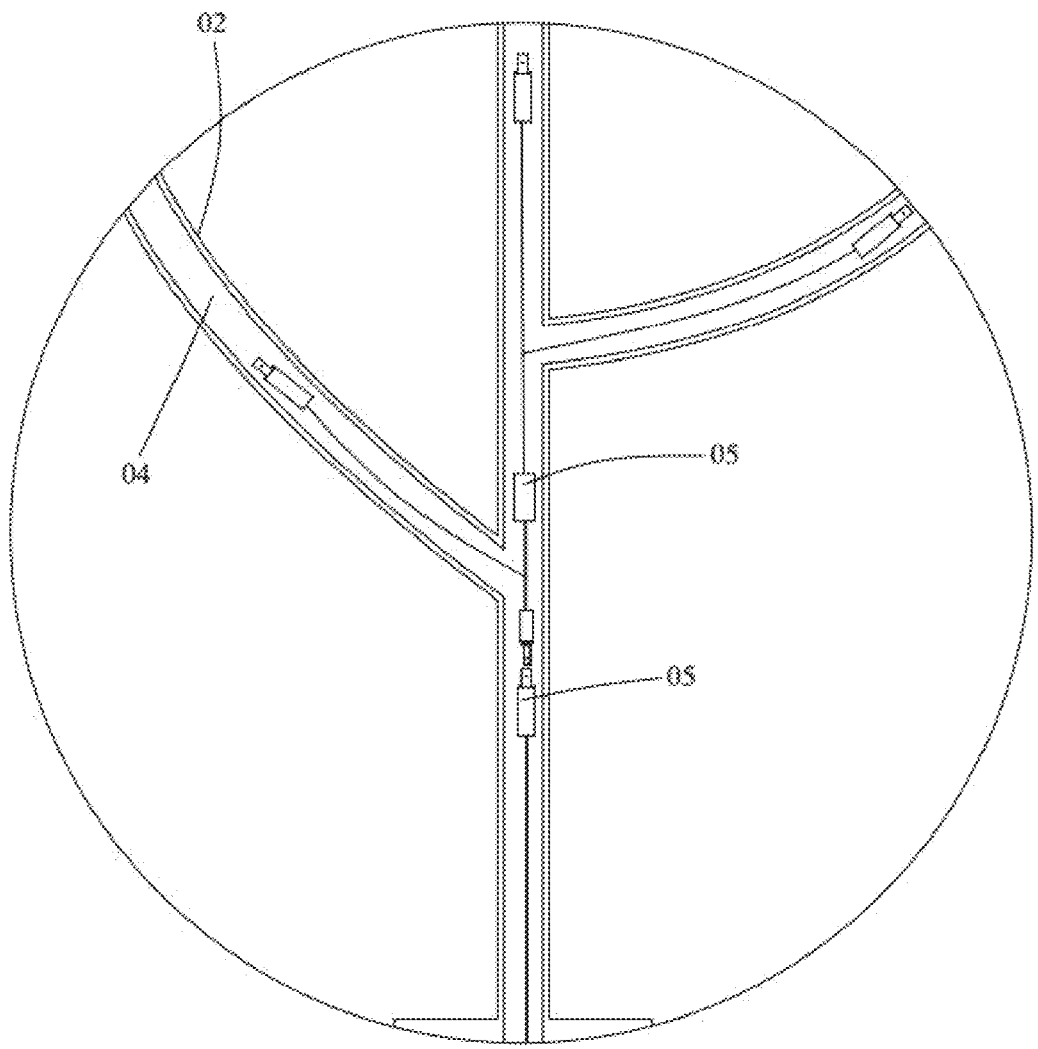
FIG. 2 is an enlarged view of A of the present disclosure.

Numeral reference: 01—base; 02—support frame; 03—support board; 04—installation channel; 05—cable connector; 06—power outlet joint; 07—power inlet joint; 08—grip column; 09—reinforcing column; 10—plug-in column; 11—installation hole; 12—connection column; 13—socket; 14—connection hole; 15—reinforcement block; 16—protective wire; 17—connection wire; 18—dispersing block; 19—guide block; 20—guide groove; 21—clamp hole; 22—clamp column.

DESCRIPTION OF EMBODIMENTS

Below, a clear and complete description of the technical solution in the embodiments of the present disclosure will be provided in combination with the accompanying drawings.

Please refer to FIGS. 1-6, a storage rack of the present disclosure includes a base 01 for placing on a bottom surface. A support frame 02 is fixedly provided on the base 01 through a fastener, and a plurality of support boards 03 are provided on the support frame 02. An electrical appliance, such as a lamp, is provided on the support boards 03. The support frame 02 is provided with an installation channel 04, the installation channel 04 is provided with a plurality of cable connectors 05 that are communicated with each other; the cable connectors 05 are electrically connected to the electrical appliance. Providing the cable connectors 05 in the support frame 02 can effectively prevent external mechanical damage, such as preventing insects and rodents from biting wires and extending the service life of the cable connectors 05; at the same time, it renders the storage rack more tidy and beautiful, thereby enhancing its aesthetic appeal.

The cable connectors 05 are used to connect a lighting fixture or other electrical appliances on the storage rack to an external power source by providing them inside the support frame 02 of the storage rack. The cable connectors 05 include a power outlet joint 06 and a power inlet joint 07 that are cylindrical and mutually cooperated. By designing the cable connectors 05 as a cylindrical shape, compared to other shapes such as squares and trapezoids, the cable connectors 05 can smoothly pass through the installation channel 04 during installation.

Figure 3:
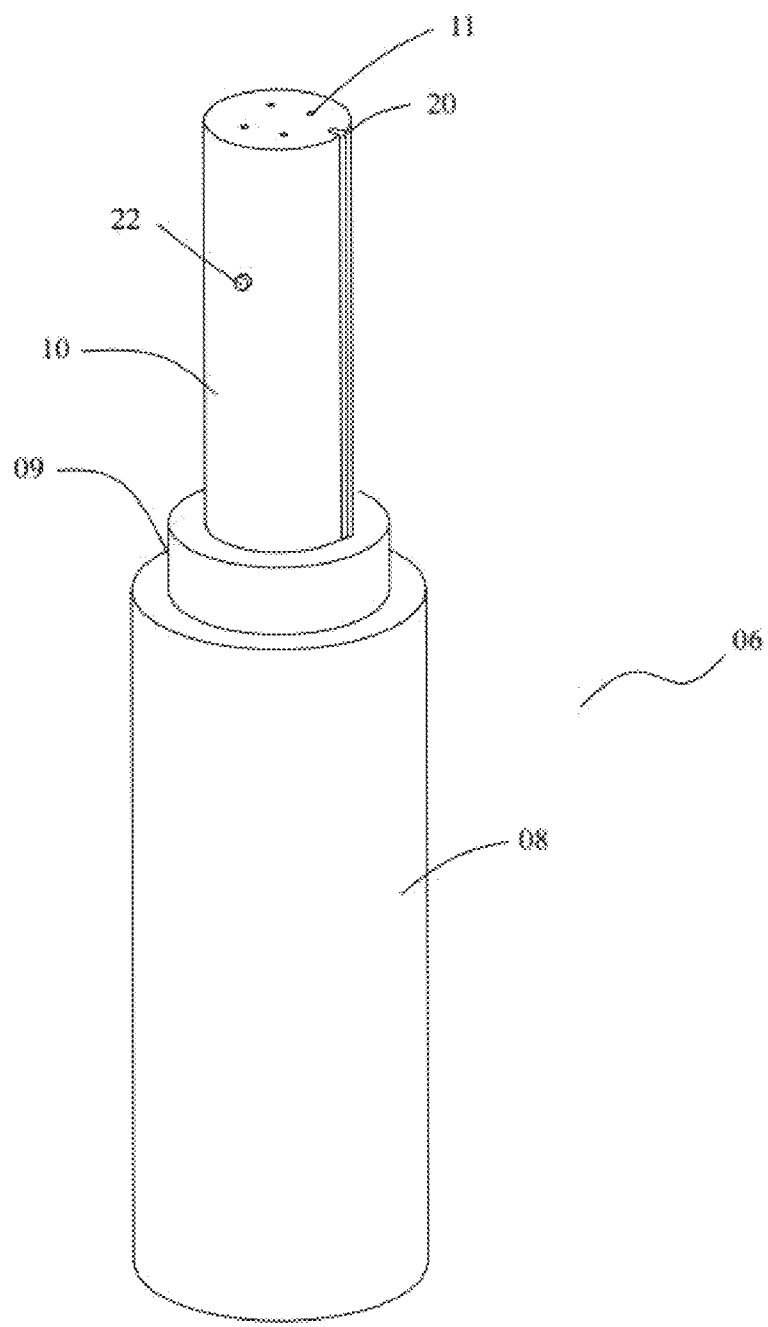
FIG. 3 is a perspective view of a power outlet joint of the present disclosure.

Please refer to FIG. 3, the power outlet joint 06 includes a grip column 08, and a reinforcing column 09 is provided on the grip column 08. The reinforcing column 09 is provided with a plug-in column 10, the reinforcing column 09 is located between the plug-in column 10 and the grip column 08. A diameter gradually increases from the plug-in column 10 to the grip column 08. The plug-in column 10, the reinforcing column 09, and the grip column 08 are all made of plastic that is integrated processing. A plurality of installation holes 11 are provided in the plug-in column 10. In an implementation mode, four installation holes 11 were provided in the plug-in column 10. The number of the installation holes 11 should be set according to an actual situation. There are no restrictions here. A cylindrical socket terminal is fixedly provided in the installation hole 11.

Figure 4:
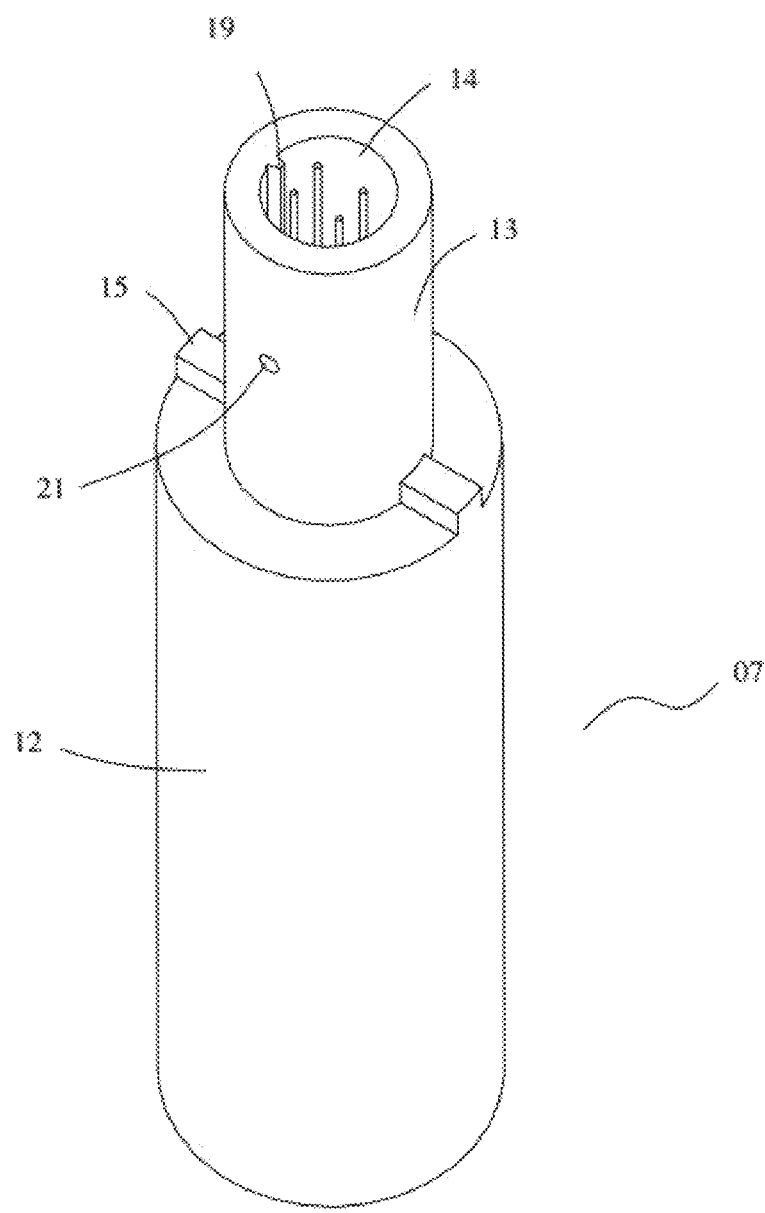
FIG. 4 is a perspective view of the power inlet joint of the present disclosure.

Please refer to FIG. 4, the power inlet joint 07 includes a cylindrical connection column 12, on which a socket 13 is provided. A diameter of the connection column 12 is larger than that of the socket 13. The socket 13 is provided with a connection hole 14 that is in compatible with the plug-in column 10. A cylindrical pin terminal that is compatible with the socket terminal is provided in the connection hole 14. Both the pin terminal and the socket terminal are made of conductive metals, such as copper or aluminum. There are wires provided in the connection column 12. Two sides of the socket 13 are symmetrically provided with a reinforcement block 15, one end of the reinforcement block 15 is fixedly connected to the connection column 12, and the other end of the reinforcement block 15 is extended along an axial direction of the socket 13 and is a free end. The reinforcement block 15 has a same effect as the reinforcing column 09.

During use, when the plug-in column 10 on the power outlet joint 06 is inserted into the connection hole 14 on the power inlet joint 07, the pin terminal will also be inserted into the socket terminal. An electrical connection is achieved through a contact between the pin terminal and the socket terminal. As the reinforcing column 09 is provided on the power outlet joint 06, the reinforcing column 09 is located between the plug-in column 10 and the grip column 08 and has a diameter larger than that of the plug-in column 10. When both the plug-in column 10 and the grip column 08 are subjected to an external force, a stress concentration can be reduced by the reinforcing column 09, the external force was dispersed or transmitted from the plug-in column 10 and the grip column 08, thereby avoiding a phenomenon of easy breakage of the plug-in column 10 and improving its service life.

Both the power outlet joint 06 and the power inlet joint 07 are provided with wires, and one end of the wire located in the power outlet joint 06 is connected to the socket terminal; the other end thereof is extended through the reinforcing column 09 and the grip column 08 to an outside of the power outlet joint 06. One end of the wire located in the power inlet joint 07 is electrically connected to the pin terminal, and the other end thereof is extended through the connection column 12 to an outside of the power inlet joint 07.

Figure 5:
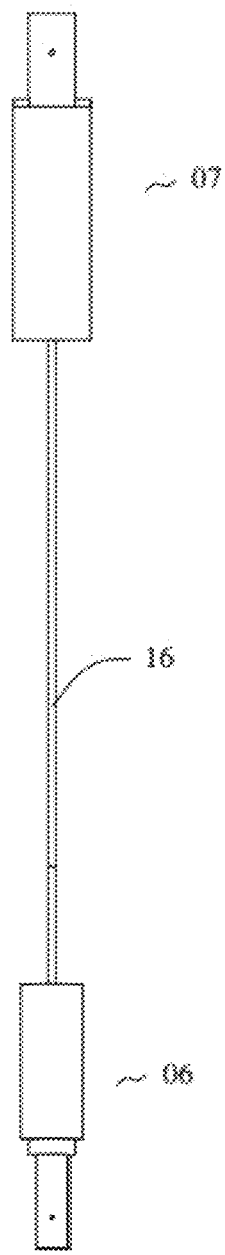
FIG. 5 is a front view of a first mode of a cable connector of the present disclosure.

Both the grip column 08 and the connection column 12 are provided with protective wires 16, and the wires located outside the power outlet joint 06 and the power inlet joint 07 are all located in the protective wires 16. When two protection wires 16 are integrated. The power outlet joint 06 and the power inlet joint 07 are connected as a whole through the protective wire 16. During use, two or more cable connectors 05 are placed in the support frame 02 of the storage rack, the power outlet joint 06 of one cable connector 05 is inserted into the power inlet joint 07 of the other cable connector 05, the two cable connectors 05 are combined, which are equivalent to providing the power outlet joint 06 and the power inlet joint 07 at two ends of the protective wire 16 (as shown in FIG. 5). When the two protective wires 16 are separated, they can be connected to an external power source.

Figure 6:
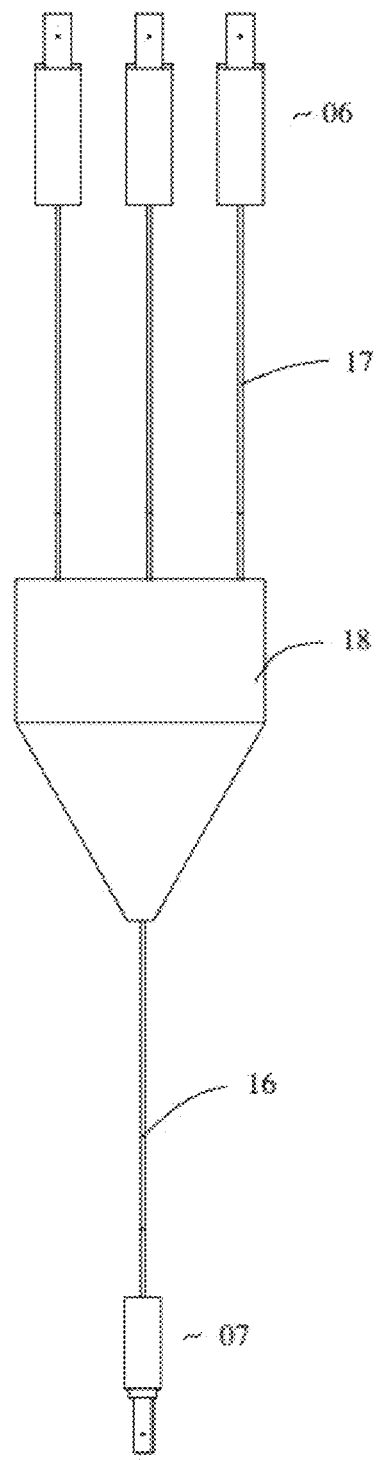
FIG. 6 is a front view of a second mode of the cable connector of the present disclosure.

At the same time, a dispersing block 18 is provided at one end of the protective wire 16, and a plurality of connection wire 17 with a same structure as the protective wire 16 can be provided at the other end of the dispersing block 18. Each end of the connection wires 17 is provided with the power outlet joint 06, and the other end of the protective wire 16 is provided with the power inlet joint 07 (as shown in FIG. 6). On the contrary, the power inlet joint 07 is provided on the connection wire 17 and the power outlet joint 06 is provided on the protective wire 16. Thus, it is equivalent to providing the power inlet joint 07 at one end of the protective wire 16 and a plurality of power outlet joints 06 at the other end of the connection wire 17. Due to an installation of multiple lamps or other appliances on the storage rack during use, lamps or appliances located on the same plane, they are respectively provided at sides of the support frame 02 of the storage rack. Therefore, by providing the cable connectors 05 in the support frame 02, power can be provided to the lamps or other electrical appliances on two sides of the support frame 02 simultaneously.

Due to a fact that the cable connectors 05 in the present application are used for transmitting power, in order to ensure that no error between adjacent cable connectors 05 when the cable connectors 05 are connected. Therefore, a guide block 19 is provided along an axial direction in the connection hole 14 of the power inlet joint 07, and a guide groove 20 that is compatible with the guide block 19 is provided on an outer surface of the plug-in column 10 of the power outlet joint 06. When in use, it is achieved through a cooperation of the guide block 19 and the guide groove 20, thereby preventing an operator from making directional errors when connecting the two cable connectors 05, and improving the safety.

To prevent a phenomenon of easy detachment of the two cable connectors 05 after connection. A clamp hole 21 that is radically penetrated is provided on the socket 13. An axis of the clamp hole 21 is perpendicular to an axis of the guide block 19. An outer surface of the plug-in column 10 is symmetrically provided with a clamp column 22 that is compatible with the clamp hole 21. An axis of the clamp column 22 is perpendicular to an axis of the guide groove 20.

If there are directional indications (such as up, down, left, right, front, rear, etc.) involved in the embodiments of the present disclosure, the directional indications are only used to explain a relative position relationship and motion of each component in a specific posture (as shown in the attached drawings). If a specific posture changes, the directional indications will also change accordingly.

The above embodiments are only a description of the preferred embodiments of the present disclosure and do not limit the scope of the present disclosure. Without departing from the design spirit of the present disclosure, various modifications and improvements made by those skilled in the art pertain to the technical solution of the present disclosure should fall within the protection scope determined by the claims of the present disclosure.

What is claimed is:

1. A storage rack, comprising a base, wherein the base is provided with a support frame, the support frame is provided with a plurality of support boards, the support boards are provided with an electrical appliance, and the support frame is provided with an installation channel, the installation channel is provided with a plurality of cable connectors that are communicated with each other, the cable connectors are electrically connected to the electrical appliance;
   wherein the cable connectors comprise a protective wire, a first end of the protective wire is connected with a power inlet joint, and a second end of the protective wire is electrically connected with at least one power outlet joint;
   the at least one power outlet joint and the power inlet joint are both cylindrical and compatible with each other;
   the power inlet joint is provided with a socket, the socket is provided with a connection hole, and a guide block is disposed in the connection hole along an axial direction;
   an outer surface of a plug-in column of the power outlet joint is provided with a guide groove that is compatible with the guide block;
   the socket is provided with clamp holes, and the clamp holes radially penetrate through the socket;
   an axis of the clamp holes is perpendicular to an axis of the guide block;
   clamp columns are symmetrically disposed on an outer surface of the plug-in column, and the clamp columns are matched with the clamp holes;
   an axis of the clamp columns is perpendicular to an axis of the guide groove.

2. The storage rack according to claim 1, wherein the at least one power outlet joint comprises a grip column, the grip column is provided with a reinforcing column;
   the reinforcing column is provided with the plug-in column;
   the reinforcing column is located between the plug-in column and the grip column;
   the plug-in column is provided with a plurality of installation holes;
   each of the plurality of installation holes is fixedly provided with a cylindrical socket terminal.

3. The storage rack according to claim 2, wherein the power inlet joint comprises a cylindrical connection column, the connection column is provided with the socket, and a diameter of the connection column is greater than a diameter of the socket;
   the connection hole is provided with a cylindrical pin terminal that is compatible with the socket terminal.

4. The storage rack according to claim 3, wherein reinforcement blocks are symmetrically disposed on two sides of the socket;
   a first end of each of the reinforcement blocks is fixedly connected to the connection column, and a second end of each of the reinforcing blocks is extended along an axial direction of the socket.

5. The storage rack according to claim 1, wherein the other end thereof is provided with one power outlet joint the at least one power outlet joint only comprises one power outlet disposed on the second end of the protective wire.

6. The storage rack according to claim 1, wherein a dispersing block is disposed on the second end of the protective wire, one end of the dispersing block is provided with a plurality of connection wires, the at least one power outlet joint comprises a plurality of power outlet joints, and the plurality of connection wires are respectively connected with the plurality of power outlet joints.

* * * * *